(12) United States Patent
Klonowski et al.

(10) Patent No.: US 10,120,013 B2
(45) Date of Patent: Nov. 6, 2018

(54) DEVICE AND METHOD FOR MONITORING AN ELECTRICAL NETWORK

(71) Applicants: Thomas Klonowski, Sedzere (FR); SAFRAN ELECTRICAL & POWER, Blagnac (FR)

(72) Inventors: Thomas Klonowski, Sedzere (FR); Ludovic Ybanez, Fontenilles (FR)

(73) Assignees: SAFRAN ELECTRICAL & POWER, Blagnac (FR); Thomas Klonowski, Sedzere (FR)

( * ) Notice: Subject to any disclaimer, the term of this patent is extended or adjusted under 35 U.S.C. 154(b) by 559 days.

(21) Appl. No.: 14/411,164

(22) PCT Filed: Jun. 27, 2013

(86) PCT No.: PCT/EP2013/063547
§ 371 (c)(1),
(2) Date: Dec. 24, 2014

(87) PCT Pub. No.: WO2014/001466
PCT Pub. Date: Jan. 3, 2014

(65) Prior Publication Data
US 2015/0204935 A1 Jul. 23, 2015

(30) Foreign Application Priority Data

Jun. 28, 2012 (FR) ...................... 12 56146

(51) Int. Cl.
*G01R 31/08* (2006.01)
*G01R 31/14* (2006.01)

(52) U.S. Cl.
CPC ......... *G01R 31/088* (2013.01); *G01R 31/086* (2013.01); *G01R 31/14* (2013.01); *Y04S 10/522* (2013.01)

(58) Field of Classification Search
CPC .... G01R 31/086; G01R 31/14; G01R 31/088; G01R 31/08; Y04S 10/522
See application file for complete search history.

(56) References Cited

U.S. PATENT DOCUMENTS

| 7,973,536 | B2 * | 7/2011 | Kojovic | G01R 31/085 324/509 |
| 8,598,887 | B2 * | 12/2013 | Bjorklund | G01R 31/088 324/535 |

(Continued)

FOREIGN PATENT DOCUMENTS

| CN | 2771873 Y | 4/2006 |
| WO | 2009/005223 A1 | 1/2009 |

OTHER PUBLICATIONS da Silva, "A Fault Locator for Three-Terminal Lines Based on Wavelet Transform Applied to Synchronized Current and Voltage Signals", 2006, IEEE PES Transmission and Distribution Conference and Exposition Latin America, Venezuela, pp. 1-6.*

Altaf, Saud et al., "Fault Diagnosis and Detection in Industrial Motor Network Environment Using Knowledge-Level Modelling Technique", Jan. 9, 2017, Hindawi Publishing Corporation Modelling and Simulation in Engineering vol. 2017, Article ID 1292190, pp. 1-10, https://doi.org/10.1155/2017/1292190.*

(Continued)

*Primary Examiner* — Mischita Henson
(74) *Attorney, Agent, or Firm* — Oblon, McClelland, Maier & Neustadt, L.L.P.

(57) ABSTRACT

A method and device for monitoring an electrical network, including: a mechanism detecting electrical signals and additional signals produced in the electrical network, the additional signals being of a different physical nature to the electrical signals; a mechanism for processing the electrical signals to define a first time reference representing a detection time of the electrical signals emitted upon a fault event arising in the electrical network; a mechanism processing the additional signals to define a second time reference representing a detection time of the additional signals emitted upon the fault event arising in the electrical network; and (Continued)

a processor spatially locating the fault event in the electrical network according to the first and second time references.

8 Claims, 8 Drawing Sheets

(56) References Cited

U.S. PATENT DOCUMENTS

| | | | |
|---|---|---|---|
| 2004/0230387 A1* | 11/2004 | Bechhoefer | G01R 31/11 |
| | | | 702/58 |
| 2009/0161272 A1 | 6/2009 | Asokan et al. | |
| 2010/0102824 A1 | 4/2010 | Tremblay et al. | |
| 2010/0169030 A1* | 7/2010 | Parlos | G01H 1/00 |
| | | | 702/58 |

OTHER PUBLICATIONS

Tanwani, Aneel et al., "An Inversion-Based Approach to Fault Detection and Isolation in Switching Electrical Networks", 2010,IEEE Transactions on Control Systems Technology, pp. 1-17.*

International Search Report dated Jul. 30, 2013, in PCT/EP2013/063547, filed Jun. 27, 2013.

French Preliminary Search Report dated Mar. 26, 2013, in Patent Application No. FR 1256146, filed Jun. 28, 2012 (with English Translation of Category of Cited Documents).

James A. Momoh, et al., "Design and Analysis of Aerospace DC Arcing Faults using Fast Fourier Transformation and Artificial Neural Network", IEEE Power Engineering Society General Meeting, vol. 2, XP 010685982, Jan. 2003, pp. 788-793.

\* cited by examiner

DEVICE AND METHOD FOR MONITORING AN ELECTRICAL NETWORK

FIELD OF THE INVENTION

The present invention relates to a method and device for monitoring an electrical network for detecting faults or initial signs of failure in an electrical network.

STATE OF THE RELATED ART

An electrical network is used to carry electrical energy at different electrical loads and comprises conventional protection means in respect of short-circuits, overcurrents or other faults.

Conventional protection means make it possible to prevent complete degradation of the network and are effective when the faults are high-energy such as short-circuits, continuous and progressive such as overloads, one-off but with significant variations in current and voltage, or recurrent over time.

However, conventional means are only very ineffective against faults and the initial signs thereof, which are surreptitious, non-stationary and very low-energy in nature.

However, due to the difficulty in detecting these faults belonging to the electrical discharge category (for example, initial signs of the start of an electric arc, Trichel pulse, brush discharges, etc.) may damage the wiring of the electrical network.

Faults due to electrical discharges are generally well-known but are still poorly detected to date and the consequences thereof poorly diagnosed.

At the present time, there are detection techniques consisting of measuring electrical signals and processing these signals in respect of time and frequency. However, this type of detection involves the drawback of not being very reliable and particularly in the case of detection of initial signs of arcs or arc tracking. Furthermore, this detection requires a plurality of confirmations, which increases the detection time and does not allow fault location.

Further detection techniques exist based on the reflectometry principle consisting of injecting a voltage into the network and analysing the reflection induced by a potential fault in order to locate this fault.

However, injecting a voltage onto a line requires control of the line impedance, coupling with the line, a mass reference distance to be observed, etc., giving rise to complex implementation. Furthermore, reflectometry is not suitable for use in some types of networks.

Moreover, the various current techniques are not exhaustive on the detection of faults on any type of network which may be alternating, direct or split current in nature.

Consequently, the aim of the present invention is that of proposing a monitoring device and method simple to implement and capable of detecting and locating rapidly and reliably the faults in an electrical network of any nature without injecting signals into said network.

DESCRIPTION OF THE INVENTION

The present invention is defined by a device for monitoring an electrical network, comprising:
  means for detecting electrical signals and additional signals produced in the electrical network, the additional signals being of a different physical nature to the electrical signals,
  means for processing said electrical signals to define a first time reference representing a detection time of the electrical signals emitted upon a fault event arising in the electrical network,
  means for processing said additional signals to define a second time reference representing a detection time of the additional signals emitted upon said fault event arising in the electrical network, and
  processing means for spatially locating said fault event in the electrical network according to said first and second time references.

In this way, the device according to the invention simply implements, without injecting signals into the electrical network, non-intrusive detection of the electrical and additional signals in order to conduct an overall analysis of the fault by connecting the data from the electrical signals created by an electrical fault (such as the initial signs of arc, arcs, arc tracking, and partial discharges) with those from additional signals created simultaneously by the same electrical fault. This enables reliable detection and relatively precise spatial location of the fault in the network (which may be of the alternating, direct or split current type) without impeding the operation of the electrical network.

Advantageously, said processing means are configured to define the first and second time references by applying a signal processing analysis on said electrical signals and said additional signals respectively, said processing analysis being chosen from the following processing techniques: wavelet transform processing, Fourier processing, and Wigner-Ville processing.

All these analyses along with further processing techniques may be applied to the electrical and additional signals. More particularly, the wavelet transform analysis is very suitable for recognising, simply and precisely, the signature of a fault having a surreptitious and/or non-linear nature such as an electrical discharge.

Advantageously, said processing means are configured to apply discrete wavelet transform analyses.

The discrete transform enables a reliable reconstruction of the signal rapidly while preventing data redundancy during the encoding thus making it possible to minimise the backup space and memory size.

Advantageously, said processing means are configured to perform mapping identifying the location of the non-linear normal loads in said electrical network and to distinguish an actual fault event in relation to an event caused by a non-linear normal load identified in said mapping.

This helps prevent the risk of switching off the network in an untimely fashion.

Advantageously, said processing means are configured to determine values relating to quantitative factors of the fault, compare said values to critical thresholds, and trigger an immediate cutoff when one of said values exceeds the critical threshold.

This makes it possible to quantify the criticality of the fault in order to maintain continuity of service of the electrical network when the initial signs of non-critical faults are detected while determining the time at which the fault reaches a danger threshold requiring the immediate cutoff of the faulty circuit.

Advantageously, said processing means are configured to record all fault events.

This helps evaluate the degradation of the network over time.

According to one specific aspect of the present invention, the detection means comprise first means for detecting said electrical signals and second means for detecting said additional signals, said first and second detection means being installed at the same geographic location upstream from the electrical network.

Advantageously, said additional signals are mechanical wave signals.

This helps determine the coordinates of the fault event with a very high precision. It should be noted that the precision of the location of a fault is directly proportional to the difference in the electrical and mechanical signal propagation rates and that the propagation of mechanical waves is much lower than that of electrical signals.

The invention also relates to an electrical network system in an aircraft comprising a monitoring device according to any of the above features. It should be noted that the invention is applicable to all electrical networks (building, vessel, rail, motor vehicle, aircraft, etc.).

The invention also relates to a method for monitoring an electrical network, comprising the following steps:

detecting electrical signals and additional signals produced in the electrical network, the additional signals being of a different physical nature to the electrical signals, processing said electrical signals to define a first time reference representing a detection time of the electrical signals emitted on a fault event arising in the electrical network, processing said additional signals to define a second time reference representing a detection time of the additional signals emitted on said fault event arising in the electrical network, and processing for spatially locating said fault event in the electrical network according to said first and second time references.

BRIEF DESCRIPTION OF THE FIGURES

Further features and advantages of the invention will emerge on reading preferential embodiments of the invention with reference to the attached figures wherein.

DETAILED DESCRIPTION OF PARTICULAR EMBODIMENTS

The underlying concept of the invention is based on the coupling of the analysis of the electrical signals created by an electrical fault with the analysis of additional signals of different natures created by the same electrical fault.

Figure 1:
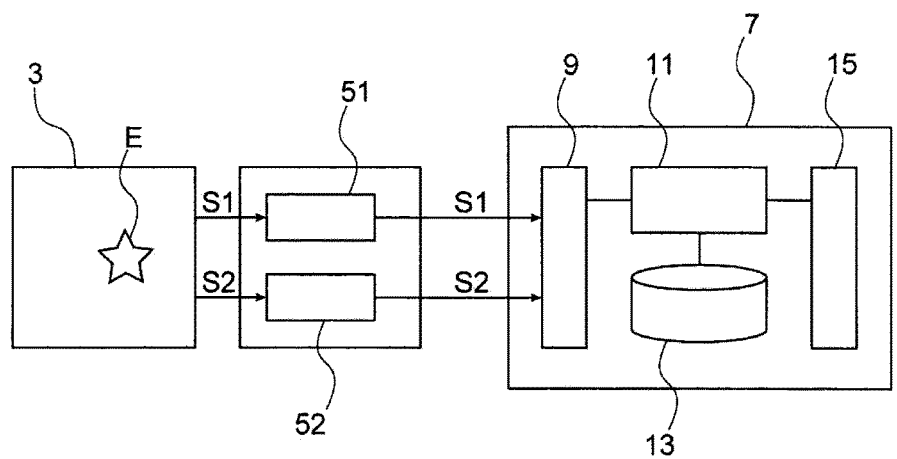
FIG. 1 illustrates schematically a device for monitoring an electrical network, according to the invention.

FIG. 1 illustrates schematically a device 1 for monitoring an electrical network 3, according to the invention. This device comprises detection means 5 and processing means 7 generally comprising input means 9, computing means 11, storage means 13, and output means 15. In particular, the processing means 7 may be used to run a computer program saved in the storage means 13 and comprising code instructions for the implementation of the monitoring method according to the invention.

The detection means 5 are configured to detect non-intrusively, electrical signals S1 and additional signals S2 produced in the electrical network 3 and the propagation rates whereof are known. The additional signals S2 are of a different physical nature to the electrical signals S1 and may be sound waves, ultrasound waves, shock waves, light waves, radio waves, etc.

More particularly, the detection means 5 comprise first detection means 51 for detecting electrical signals S1 and second detection means 52 for detecting additional signals S2. The first and second detection means 51, 52 are installed at the same geographic location upstream from the electrical network 3.

The processing means 7 are configured to process and analyse the electrical signals S1 and additional signals S2 received via the input means 9 from the detection means 5.

Firstly, the processing means 7 and more particularly the computing means 11 are configured to define a first time reference t1 representing a detection time of the electrical signals S1 emitted upon a fault event E arising in the electrical network 3 and a second time reference t2 representing a detection time of the additional signals S2 emitted upon the same fault event E.

Indeed, the processing means 7 are configured to apply a time-frequency signal processing technique on the electrical signals S1 and on the additional signals S2 in order to recognise the signature of the electrical fault E generally having a surreptitious and non-linear nature. The signal processing technique may be a short-term Fourier analysis, a (continuous or discrete) wavelet transform analysis, or an analysis using the Wigner-Ville method.

The short-term Fourier analysis is a time-frequency analysis of the signal measured by segments for detecting non-stationary phenomena. However, the Fourier analysis retains a fixed analysis window and links the signal to be analysed with sinusoidal test signals, and consequently, there is a compromise to be made between the detection of low-frequency phenomena and those having high frequencies.

The wavelet transform analysis enables a balanced spatiotemporal location not prioritising one frequency range over another, with a view to obtaining an equilibrium between the time location and the frequency location of a signal.

The basic principle of this method is that of compressing or stretching wavelets so that they are automatically adapted to the various signal components according to a so-called multi-resolution analysis. This analysis uses a narrow window to detect the high-frequency transient components and a wide window to detect the low-frequency (or long-term) components.

As a general rule, the wavelet transform consists of creating, from a mother wavelet $\psi$, a family of wavelets (or family of functions) $\psi(ax+b)$ which are affine functions where a and b are real numbers. The factor a (or expansion scale) is used to expand (a>1) or compress (a<1) the function $\psi$ and the term b (or translation factor) is used to translate said function.

The wavelet transform technique consists of transforming a signal f(t) in a two-variable function C(a,b) of "wavelet coefficient" as follows:

$$C(a, b) = \int_{-\infty}^{+\infty} f(t) \times \psi(at + b)\, dt$$

Figure 2A:
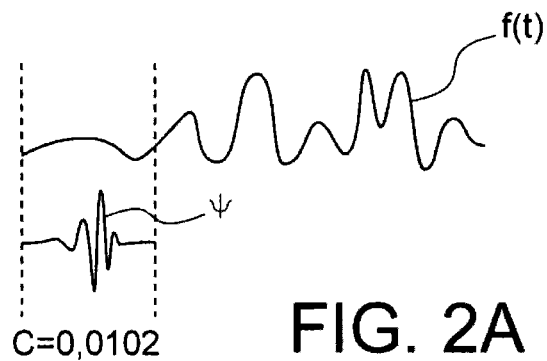
FIGS. 2A-2C illustrate the various steps of a wavelet analysis process, according to the invention.
Figure 2B:
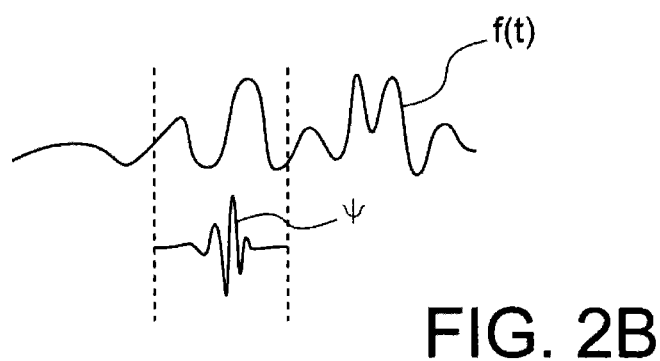
Figure 2C:
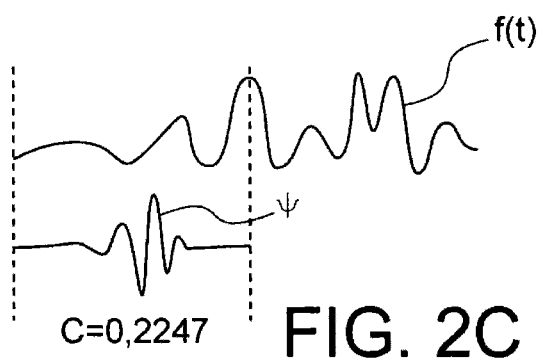

FIGS. 2A-2C illustrate the various steps of the wavelet analysis process.

The first step (FIG. 2A) consists of selecting a wavelet ψ and comparing said wavelet to a portion of the signal f(t) starting at the same initial time as the original signal.

The second step (FIG. 2A) consists of computing a number C corresponding to the wavelet coefficient. The higher this coefficient is, the greater the similarity between the interval of the signal and the wavelet. The wavelet coefficient may be interpreted as a correlation coefficient if the signal and the wavelet are of unitary energy. In this way, the more this coefficient tends towards 1, the higher the likelihood of detecting a fault event.

According to the example in FIG. 2A, C=0.0102 but obviously the value of the coefficient is also dependent on the shape and properties of the wavelet selected (orthogonal, biorthogonal, oblique, non-orthogonal, wavelet support, wavelet oscillation, etc.).

The third step (FIG. 2B) consists of translating the wavelet ψ to the right (i.e. in the direction of time) and the first and second steps are then repeated until the entire signal is covered.

The fourth step (FIG. 2C) consists of expanding or contracting (according to the algorithm used) the wavelet, and the previous steps are repeated.

The fifth step consists of repeating the previous steps for each expansion scale.

It should be noted that in the case of a continuous transform, the wavelet may be translated and expanded, indefinitely (within the limit of the computerised processing means sampling interval), resulting in the infringement of the wavelets on each other. The resulting advantage is that the data encoded by one wavelet is also encoded by the adjacent wavelets. This results in the concept of data redundancy (in practice, the continuous transform is redundant by a factor of 10). A further advantage is the invariance by translation and thus the lack of a need to specify the source of the encoding. In other words, the coefficients do not change if the source is moved and it is thus easier to analyse the data and recognise the patterns.

On the other hand, in a discrete transform, the wavelet is only translated and expanded according to discrete values:

$$C(a, b) = \int_{-\infty}^{+\infty} f(t) \times \Psi(at + b)\, dt$$

where $a = 2^j$, $b = k2^j$, $(j, k) \in Z^2$

In this case, the expansion factor a and translation factor b are based on a power of 2 giving a so-called dyadic representation. This means that the wavelets will provide a representation with much less data redundancy than the continuous transform. The data redundancy will be dependent on the structure of the wavelet chosen (orthogonal, biorthogonal, oblique, etc.).

The advantage resulting from a discrete transform is the perfect reconstruction of the signal while preventing data redundancy during encoding. A gain in the backup space and memory size will thus be obtained.

In the context of signal detection, it is simply necessary to identify the wavelet coefficients without needing to reconstruct the signal on the basis of these coefficients. It should be noted that, for the signal processing speed and backup space size optimisation, it is more advantageous to perform a discrete signal analysis.

In this way, by applying for example the discrete wavelet transform processing technique, the processing means 7 determine the first and second time references t1 and t2 corresponding respectively to the detection times of the electrical signals and the additional signals from a fault event E. Indeed, the time references t1 and t2 correspond to the very high wavelet coefficient occurrence times with respect to the electrical signals S1 and additional signals S2.

Furthermore, the processing means 7 are configured to spatially locate the fault event in the electrical network 3 as a function of the first and second time references t1 and t2.

Indeed, given the propagation rates of the electrical signals S1 and additional signals S2 and the time difference between the detection times t1 and t2, the coordinates of the fault event E may be readily inferred.

Advantageously, the processing means 7 are further configured to map the electrical network 3 in order to identify the location of the non-linear normal loads having similar signatures to those of the faults, and save the mapping data in the storage means 13. This enables the processing means 7 to distinguish an actual fault event E compared to an event caused by a non-linear normal load identified in the mapping.

Furthermore, the processing means 7 are configured to determine values relating to quantitative factors of the fault E which may be the duration thereof, energy thereof, and the progression thereof on the network 3. This enables the processing means 7 to quantify the criticality of the fault by comparing each of these values to a corresponding critical threshold. In this way, the processing means 7 trigger via the output means 15 an immediate cutoff of the network 3 when one of these values exceeds the corresponding critical network. On the other hand, if the critical thresholds are not reached, the fault and the characteristics thereof are stored in memory in the storage means 13 while keeping the network 3 in operation.

It should be noted that the processing means 7 are configured to save in memory all the fault events and the characteristics thereof in order to evaluate the degradation of the network 3 over time.

Figure 3:
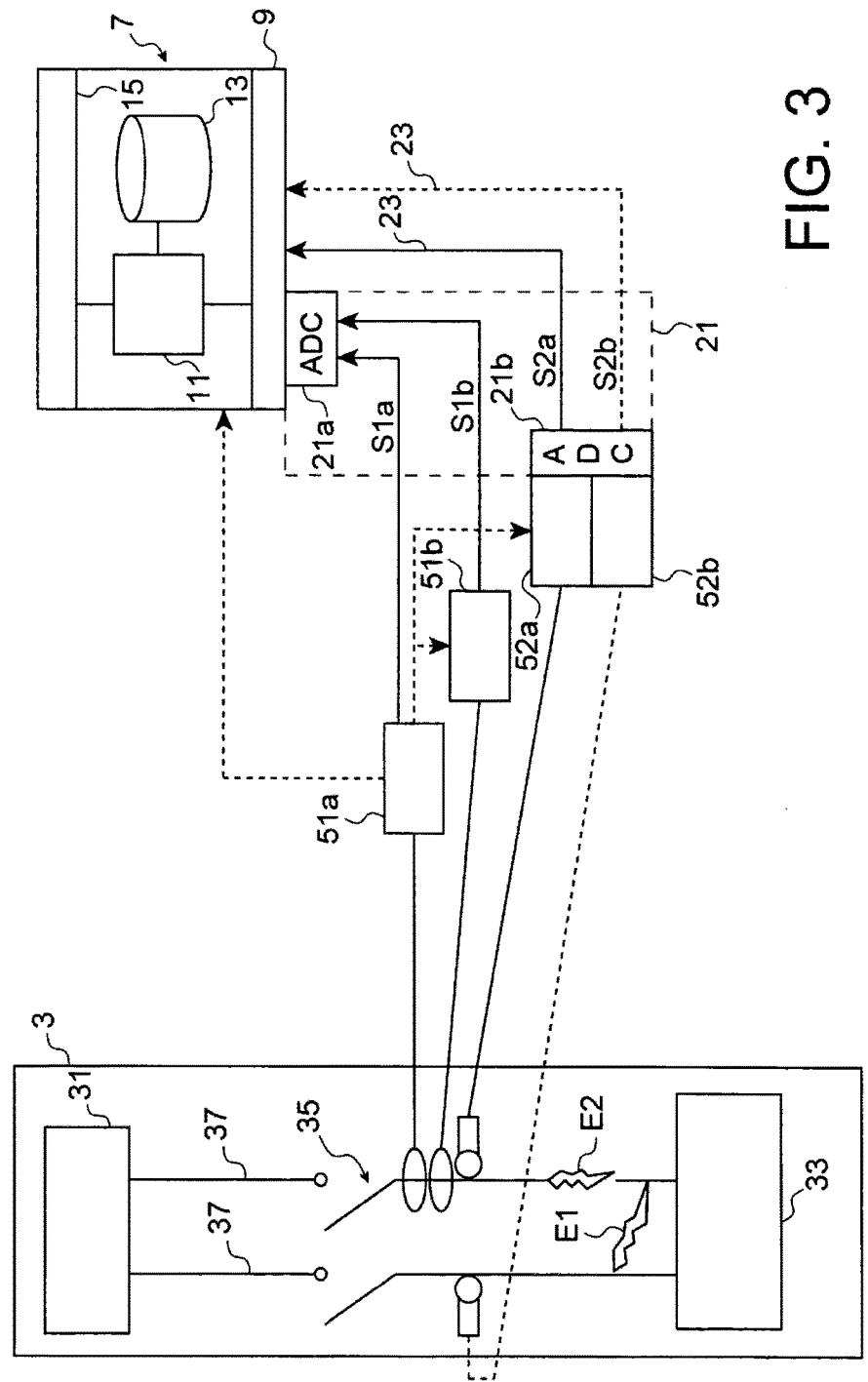
FIG. 3 illustrates schematically a device for monitoring an electrical network according to a preferred embodiment of the invention.

FIG. 3 represents a device for monitoring an electrical network according to a preferred embodiment of the invention.

The electrical network 3 comprises an electrical power supply 31, electrical loads 33, at least one protection circuit breaker 35, and electrical cables 37.

The monitoring device 1 is connected to the electrical network 3 and comprises detection means 5, and processing means 7.

As above, the monitoring is based on dual detection. The first detection relates to the detection of the electrical phenomenon by measuring and analysing the current S1a and the electrical voltage S1b of the monitored line. The second detection relates to the detection of the additional signals S2a of the same phenomenon in order to be able to confirm the detection thereof and locate same. According to this embodiment, the additional signals S2a are sound or ultrasound type mechanical wave (or vibration) signals having a very good propagation in copper or in aluminium.

Indeed, the creation of an electric arc, particularly in the case of high-energy networks, generates acoustic waves which may have very high amplitudes. The amplitude |A| of the acoustic waves of an electric arc is given by the following formula:

$$|A| = \frac{\partial W}{\partial t}$$

where W is the energy dissipated in the arc. It should be noted than an electric arc may create at the inception thereof a noise of up to 120 dBA.

Since an electric arc or a discharge E1, E2 is a very non-linear phenomenon initially, the sudden variation in power will generate the transmission of noise having a very brief and very high acoustic amplitude in a cable wire. The speed of sound in copper being 3350 m/s at a temperature of 25° C., it is thus easy to detect the time and the place that the fault will occur in the electrical network 3. This location will be particularly precise when the detection is performed by coupling the analysis of the electrical signals S1a, S1b and the analysis of the sound and ultrasound signals S2a.

In this way, the detection means 5 comprise first means 51a, 51b for detecting electrical signals S1a, S1b and second means 52a for detecting mechanical wave signals S2a.

More particularly, the first detection means 51a, 51b comprise means for measuring electrical current 51a and means for measuring electrical voltage 51b and the second detection means comprise means for measuring mechanical vibration 52a. The various measuring means 51a, 51b, and 52a are installed upstream from the electrical network 3 in the same geographical location. The measuring means may for example be integrated in a circuit breaker 35 for protecting the electrical network 3.

The current measuring means 51a use in a known manner a technology (for example of the current shunt, current torus type, etc.) suitable for the nature of the electrical network 3 which may be of the alternating, direct or split current type. The current is measured downstream from the protection circuit breaker 35 and according to a bandwidth which may be up to a few hundred kHz.

Advantageously, the detection 51a-52a and processing 7 means of the monitoring device may be self-powered by the current measuring means 51a as a function of the current flowing in the line 37.

The voltage measuring means 51b also use a technology suitable for the nature of the electrical network 3 with a bandwidth of up to a few hundred kHz. The voltage measuring means 51b are also installed downstream from the protection circuit breaker 35 and as close as possible to the current measuring means 51a.

The mechanical vibration measuring means 52a are also installed as geographically close as possible to the means for measuring voltage 51b and current 51a and downstream from the protection circuit breaker 35 so as to locate the location of the fault precisely.

The mechanical vibration measuring means 52a have a bandwidth of up to a few hundred kHz and may comprise amplifiers and microphone, piezoelectric, or accelerometric elements.

Advantageously, the mechanical vibration measurement is preferably carried out on a wire core as, at this point, the attenuation of the vibration is minimal compared to a measurement performed on an insulator.

According to one particular embodiment, the detection means comprise second mechanical vibration measuring means 52b positioned on the return of the current specific to the monitored line and as close to the protection circuit breaker 35 as possible. This makes it possible to increase the precision of the spatial location of the fault event and determine the nature thereof.

For a parallel type fault E1, the mechanical vibration signature captured by the two mechanical vibration measuring means 52a, 52b will be similar. However, for a serial type fault E2, the signature will be different on the two measuring means 52a, 52b as the mechanical vibration will need to travel via the load 33 for one of the two measuring means 52a, 52b. In this case, it is necessary to account for the effects of distortions, attenuations, and/or acquisition delays on the measuring means furthest from the fault E2.

Furthermore, the processing means 7 comprise computing means 11, storage means 13, input means 9 connected to analogue/digital converters "ADC" 21 interfacing the various measuring means 51a-52b, and output means 15 connected to output peripherals such as screens, alarms, circuit breakers, and/or printers (not shown).

It should be noted that when the mechanical vibration measurement is made on a wire core, the vibration measuring means 52a, 52b are galvanically isolated from the processing means 7 via optical fibres 23, opto-couplers, isolation transformers, etc. In this case, the ADC 21a connected to the vibration measuring means 52a, 52b is installed on the side thereof so that the galvanic isolation can be performed correctly.

Figure 4:
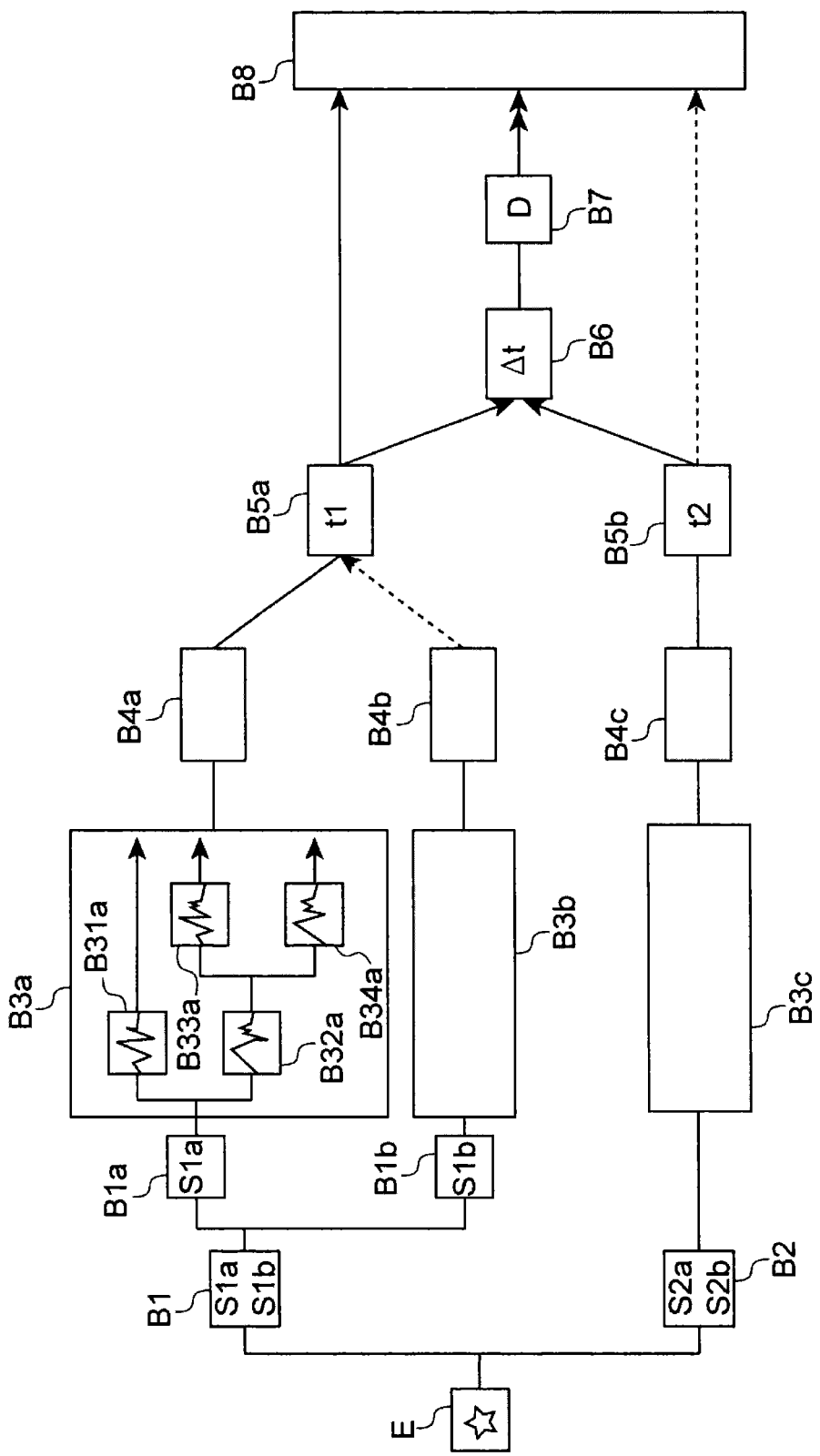
FIG. 4 is a block diagram illustrating the processing of the signals by the processing means in FIG. 3 according to a discrete wavelet transform technique.

FIG. 4 is a block diagram illustrating the processing of signals by the processing means in FIG. 3 according to the discrete wavelet transform technique.

The processing means 7 are configured to continually analyse by means of discrete wavelet transforms the electrical signals S1a, S1b and mechanical signals S2a, S2b propagated via the electrical network 3.

The block B1 corresponds to the acquisition of the electrical signals S1a, S1b. More particularly, the block B1a relates to the acquisition of the electrical current S1a and the block B1b relates to the acquisition of the electrical voltage S1b.

The block B2 corresponds to the acquisition of the mechanical signals S2a, S2b. It should be noted that for the purposes of analysis synchronism, the acquisition of the electrical signals S1a, S1b and mechanical signals S2a, S2b is performed with the same time base and thus with the same sampling frequency.

The various signals in respect of current S1a, voltage S1b, and mechanical waves S2a, S2b are broken down into the blocks B3a, B3b, and B3c respectively. For the purposes of simplification, only the block B3a is detailed given that the breakdown principle is the same for the three signals.

The multi-resolution technique known to those skilled in the art is for example used, providing a simple and quick algorithm for breaking down a signal into the components thereof at the various scales. At each step, filtering is performed with a low-pass filter (blocks B31a and B33a) to obtain the approximation coefficients and with a high-pass (blocks B32a and B34a) to obtain the detail coefficients, and the result is then decimated at the filter output. In other words, one out of every two samples is taken at the output of each filter.

Figure 5A:
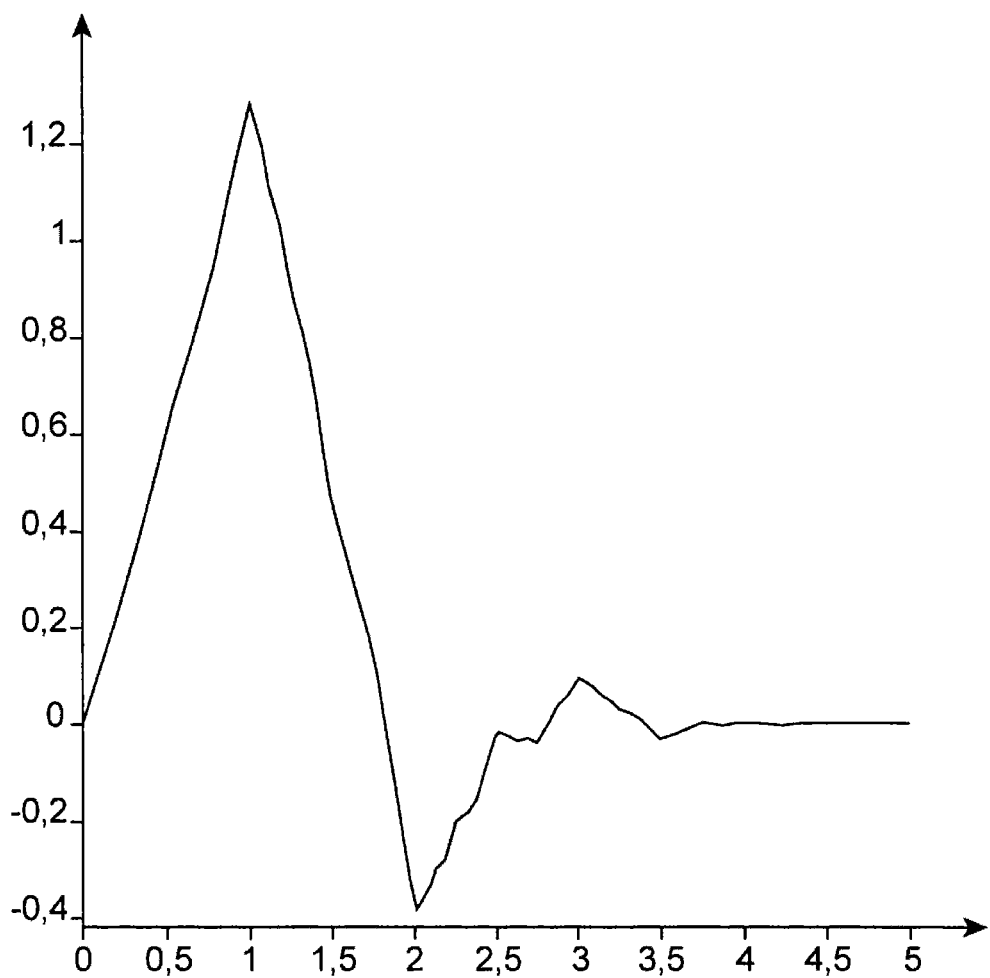
FIGS. 5A and 5B illustrate examples of low-pass and high-pass filters used in the block diagram in FIG. 4.
Figure 5B:
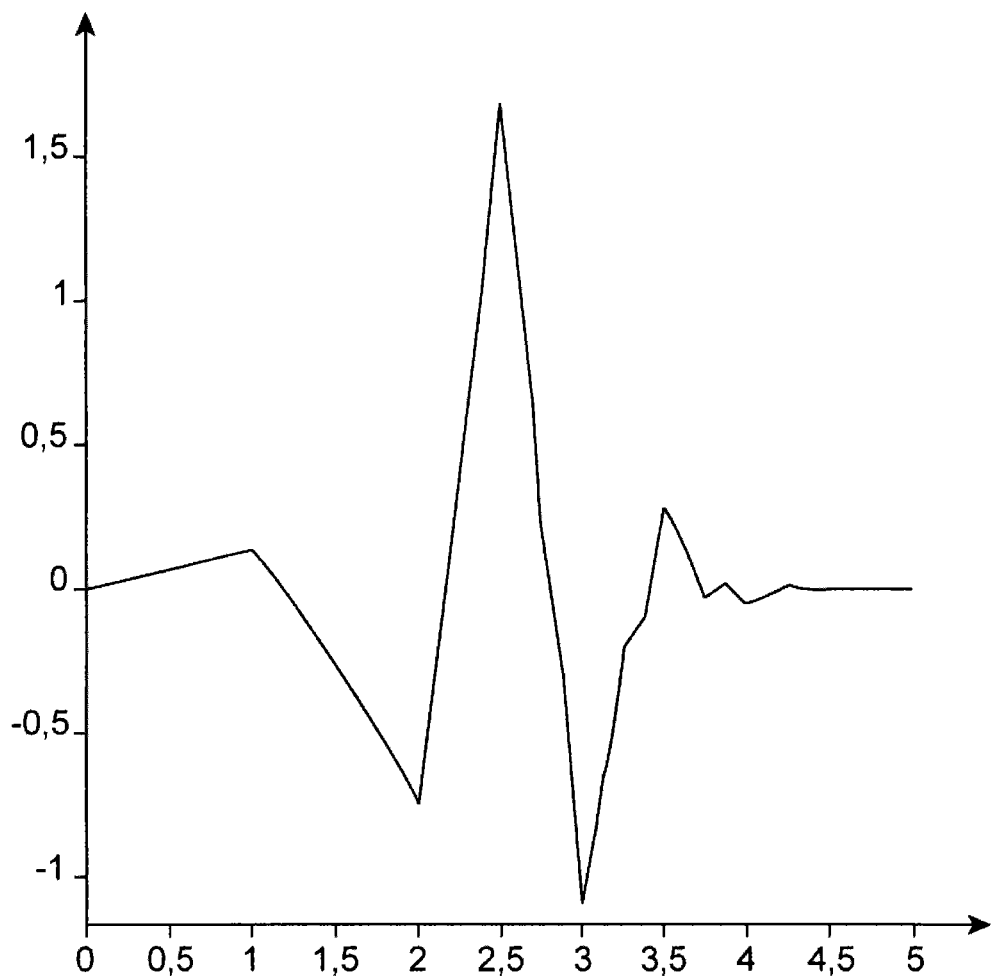

The choice of high-pass and low-pass filters is dependent on the signatures of signals to be detected. By way of example, the low-pass filter may be associated with the scale function (Daubechies 3 type) represented in FIG. 5A giving a rough image of the signal whereas the high-pass filter may be associated with the mother wavelet (Daubechies 3 type) represented in FIG. 5B encoding the details.

In this way, the initial signal S1$a$ is first filtered with the first low-pass (block B31$a$) and high-pass filters (block B32$a$). The signal at the output one of the first two filters is retained to be analysed while the signal at the output of the other filter is filtered a second time with the second low-pass (block B33$a$) and high-pass filters (block B34$a$). This process is repeated a defined number of times to break down the signal into a sequence of components at different scales. These components are then analysed to detect the occurrence of the faults.

Indeed, at the filter output, wavelet coefficients are obtained on various frequency scales. These coefficients may be represented on a scaleogram type graph (blocks B4$a$ and B4$b$). According to the wavelet transform correlation algorithm and according to the type of wavelet, the more this coefficient tends towards 1, the higher the probability of detecting the occurrence of a fault. The very high coefficients on the electrical voltage and/or current signals (block B4$a$) will serve as a time reference of the existence of the fault thus defining the time t1 (block B5$a$). It should be noted that the fault event E is detected simultaneously on the graphs relating to the current and voltage.

In block B3$c$, the multi-resolution technique may also be used to break down the signal of the mechanical waves S2$a$ or S2$b$ into the components thereof at the various scales. Similarly, the presence of high wavelet coefficients on a scaleogram type graph (blocks B4$b$) will define the time t2 (blocks B5$b$) given that a mechanical signal has a slower propagation in the direction of the measuring means.

Figure 6A:
FIGS. 6A-6C are graphs illustrating the detection of a fault event on electrical and mechanical signals, according to the invention.
Figure 6B:
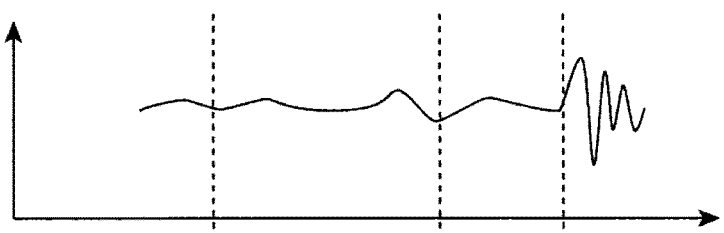
Figure 6C:
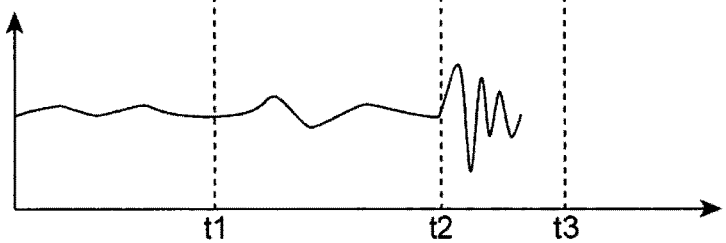

By way of example, FIGS. 6A-6C are graphs illustrating the detection of a fault event E and electrical signals S1$a$, S1$b$ and mechanical signals S2$a$, S2$b$.

More particularly, FIG. 6A illustrates an electrical signal (current S1$a$ or voltage S1$b$) and FIGS. 6B and 6C illustrate first and second mechanical signals S2$a$, S2$b$ (for example, sound wave signals) relating to first and second mechanical detection means 52$a$, 52$b$ (for example first and second microphones).

By performing a wavelet analysis with for example software such as Matlab, scaleograms (not shown) are obtained whereon the highest wavelet coefficients representing the fault occurrences may be readily identified. The time t1 indicates the start of the detection of the fault on the electrical signal S1 and the time t2 indicates the start of the detection of the same fault on the mechanical signal S2$b$ of one of the mechanical detection means.

Furthermore, the delay in the acquisition t3-t2 of the mechanical signature of the fault event between the two mechanical detection means 52$a$, 52$b$ makes it possible to increase the precision of the spatial location of the fault.

In block B6, the computing means determine the difference in time Δt=t2−t1 between the arrival of the electrical S1 and mechanical S2$b$ signals. This time Δt is used in a future step to infer the distance from the detection means at which the fault will occur.

Indeed, in block B7, the computing means 11 determine the spatial location of the fault E. The distance D of the fault in relation to the detection means 51$a$-52$b$ may be determined according to the delay Δt and the propagation rates v1 and v2 of the electrical and mechanical waves using the following equation:

$$D=\Delta t(v1 v2)/(v1-v2).$$

It should be noted that the propagation rate v2 of the mechanical wave in copper or in further conductive metals is very slow (typically 3570 m/s in copper) with respect to the propagation rate v1 of the electrical waves (typically 273000000 m/s in copper). In this way, the distance D may be computed with a high precision by merely multiplying the propagation rate v2 of the mechanical wave by the delay time Δt. The detection time of the fault event E is obviously dependent on the distance thereof and the propagation rate of the mechanical wave. For example, the detection of a fault E at 10$m$ from the detection means 51$a$-52$b$ should take less than 3 ms.

Finally, in block B8, the processing means 7 deliver via the output means 15, the time, frequency and spatial coordinates of the fault event E.

It should be noted that the detection method according to the invention is robust and has the advantage of distinguishing the signature from the signals of loads connected to the network 3 but which may have a non-linear nature, and thus preventing the risk of cutting off the network 3 in an untimely fashion and above all without reason.

Indeed, from the start of the installation of the monitoring device 1 as close as possible to the control and protection tools (circuit breaker 35), said device may continually map the electrical network 3 protected thereby and identify the location of the loads having similar electrical and mechanical signatures to the initial signs of a fault to be detected.

In this way, by means of the delay between the electrical S1 and mechanical S2 signals throughout the operation thereof, the monitoring device 1 defines the zones comprising non-linear loads. This enables the monitoring device 1 to distinguish the operation of a non-linear normal load from a fault event in that the load induces repetitive and periodic signals with no change of position on the network 3 and with no associated mechanical phenomena. Whereas the fault generates surreptitious, aperiodic and variable signals in terms of energy and location on the electrical network 3 coupled with characteristic mechanical phenomena.

Furthermore, the detection method according to the invention makes it possible for reasons of continuity of service of some electrical networks, to ensure maximum maintenance thereof despite the initial signs of a fault liable to exist during the use thereof.

Figure 7:
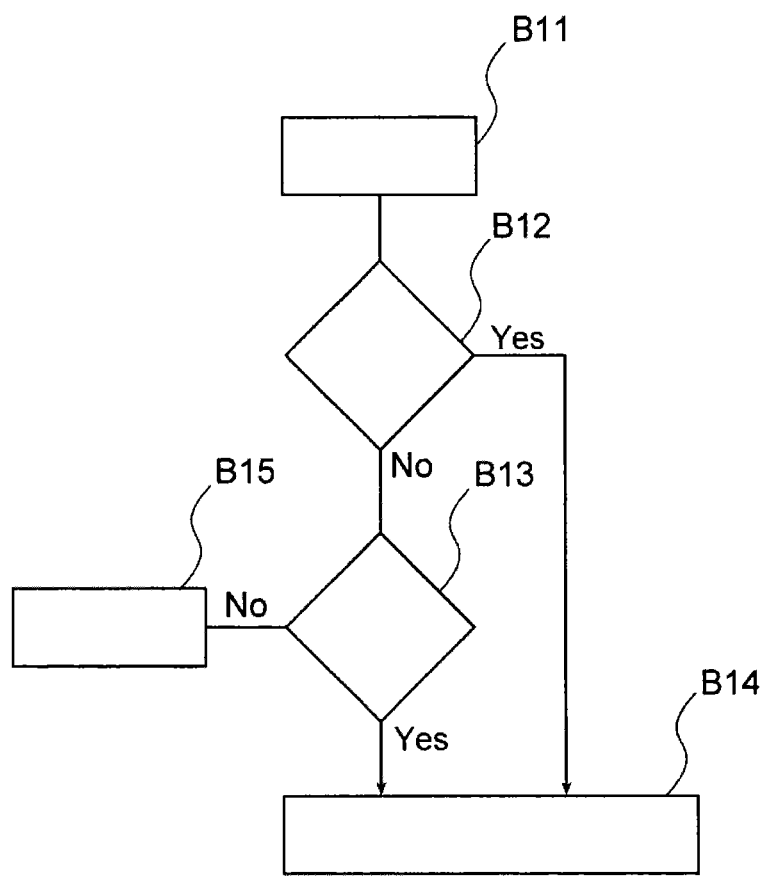
FIG. 7 is a flow chart illustrating an analysis of the progression of a fault for quantifying the danger thereof, according to the invention.

Indeed, FIG. 7 is a flow chart illustrating an analysis of the progression of a fault for quantifying the danger of the presence of the fault.

This may be performed by correlating a plurality of factors relating to the fault. These factors are for example the duration of the presence of the fault and the energy dissipated in the fault and the spatial progression of the fault in the electrical network.

More particularly, after the detection of a fault in step B11, the tests in steps B12 and B13 are performed.

In step B12, it is checked whether the fault duration or the energy dissipated in the fault exceeds a first predefined threshold. The fault duration and the dissipated energy may be characterised by the progression of the density of successive high wavelet coefficients. If the outcome of the test B12 is positive, the process goes to step B14 and otherwise goes to step B13.

In step B13, it is checked whether the advance of the fault on the network exceeds a second predefined threshold. The advance of the fault or the spatial progression of the fault in the network may be characterised by analysing the reduction of the delay between the propagation of the electrical signals and the propagation of the mechanical signals. If the outcome of the test B13 is positive, the process goes to step B14 and otherwise goes to step B15.

It should be noted that the first and second predefined thresholds may be varied according to the characteristics of the latest fault occurrences.

Step B14 indicates that the danger threshold of the fault has been reached and in this case, the processing means 7 trigger the cutoff of the faulty circuit.

In step B15, the processing means 7 save the fault parameters in the storage means 13. It is thus possible to subsequently read these parameters to envisage a suitable maintenance programme before network failure.

In this way, according to this algorithm, if at least one of the two conditions (defined in the tests in steps B12 and B13) is fulfilled then the fault is considered to have reached a danger threshold (step B14) causing the immediate cutoff of the faulty circuit. If none of the conditions is fulfilled, then the fault and the characteristics thereof will be stored in memory (step B15).

The invention is applicable to all electrical networks in buildings, vessels, motor vehicles, aircraft, and rail networks.

It should be noted that the monitoring device is particularly suitable for monitoring the electrical wiring in an aircraft. It makes it possible to analyse the electrical and mechanical signals in the aircraft wiring in order to determine the difference in time between the detection of the electrical and mechanical signals of a fault event, determine the distance from the anomaly, determine the energies involved in the events processed, and record all the behaviours in order to assess the degradation of the wirings over time.

It should be noted that the monitoring device 1 may then be integrated in a specific unit or be part of an electronic unit existing in the aircraft. Advantageously, the detection means may be connected to acquisition and processing means of an onboard computer, an electro-mechanical circuit breaker, or any other item of equipment in the aircraft to operate the monitoring method according to the invention.

The invention claimed is:

1. A device for monitoring an electrical network, comprising:
    circuitry including a first detector and a second detector, the first detector being configured to detect electrical signals, and the second detector being configured to detect additional signals produced in the electrical network, the additional signals being mechanical wave signals, which are of a different physical nature from the electrical signals, the first detector and second detector being installed at a same geographic location upstream from the electrical network, wherein
    the circuitry is configured to
        process the electrical signals to define a first time reference representing a detection time of the electrical signals emitted upon a fault event corresponding to arcs, arc tracking, or partial discharges arising in the electrical network,
        process the additional signals to define a second time reference representing a detection time of the additional signals emitted upon the same fault event arising in the electrical network, and
        spatially locate the fault event in the electrical network according to the first and second time references, the location of the fault event being determined as a function of a difference between the first and second time references given different propagation rates between the electrical and mechanical signals.

2. The device according to claim 1, wherein the circuitry is configured to define the first and second time references by applying a signal processing analysis on the electrical signals and the additional signals respectively, the signal processing analysis being chosen from the following processing techniques: discrete wavelet transform processing, Fourier processing, and Wigner-Ville processing.

3. The device according to claim 2, wherein the circuitry is configured to apply, as the signal processing analysis, discrete wavelet transform analyses.

4. The device according to claim 1, wherein the circuitry is configured to perform mapping identifying a location of non-linear normal loads in the electrical network and to distinguish an actual fault event in relation to an event caused by a non-linear normal load identified in the mapping.

5. The device according to claim 1, wherein the circuitry is configured to determine values relating to quantitative factors of the fault event, compare the values to critical thresholds, and trigger an immediate cutoff when one of the values exceeds the critical threshold.

6. The device according to claim 1, wherein the circuitry is configured to record all fault events.

7. An electrical network system in an aircraft comprising:
    a monitoring device including circuitry that includes a first detector and a second detector, the first detector being configured to detect electrical signals, and the second detector being configured to detect additional signals produced in the electrical network, the additional signals being mechanical wave signals, which are of a different physical nature from the electrical signals, the first detector and second detector being installed at a same geographic location upstream from the electrical network, wherein
    the circuitry is configured to
        process the electrical signals to define a first time reference representing a detection time of the electrical signals emitted upon a fault event corresponding to arcs, arc tracking, or partial discharges arising in the electrical network,
        process the additional signals to define a second time reference representing a detection time of the additional signals emitted upon the same fault event arising in the electrical network, and
        spatially locate the fault event in the electrical network according to the first and second time references, the location of the fault event being determined as a function of a difference between the first and second time references given different propagation rates between the electrical and mechanical signals.

8. A method for monitoring an electrical network, comprising:
    detecting, by a first detector, electrical signals, and detecting, by a second detector, additional signals produced in the electrical network, the additional signals being mechanical wave signals, which are of a different physical nature from the electrical signals, the first detector and second detector being installed at a same geographic location upstream from the electrical network;
    processing the electrical signals to define a first time reference representing a detection time of the electrical signals emitted on a fault event corresponding to arcs, arc tracking, or partial discharges arising in the electrical network;
    processing the additional signals to define a second time reference representing a detection time of the additional signals emitted on the same fault event arising in the electrical network; and
    spatially locating the fault event in the electrical network according to the first and second time references, the location of the fault event being determined as a function of a difference between the first and second time references given different propagation rates between the electrical and mechanical signals.

* * * * *